United States Patent [19]
Mendez

[11] 3,947,126
[45] Mar. 30, 1976

[54] METHOD FOR IMAGE ALIGNMENT
[75] Inventor: William M. Mendez, Princeton, N.J.
[73] Assignee: Oxy Metal Industries Corporation, Detroit, Mich.
[22] Filed: Oct. 9, 1973
[21] Appl. No.: 404,825

[52] U.S. Cl. ............................. 356/150; 356/172
[51] Int. Cl.² ........................................ G01B 9/04
[58] Field of Search ......... 101/128.4; 356/138, 139, 356/150, 169, 170, 171, 172

[56] References Cited
UNITED STATES PATENTS

| | | | |
|---|---|---|---|
| 3,175,458 | 3/1965 | Da Costa | 356/138 |
| 3,672,778 | 6/1972 | Kern | 356/138 |
| 3,752,589 | 8/1973 | Kobayashi | 356/138 |

OTHER PUBLICATIONS

Strong, John, *Procedures in Experimental Physics*, Prentice-Hall, Inc., New York, 1938, pp. 585–586.

*Primary Examiner*—Alfred E. Smith
*Assistant Examiner*—Richard A. Rosenberger
*Attorney, Agent, or Firm*—Arthur E. Kluegel; Richard P. Mueller; B. F. Claeboe

[57] ABSTRACT

Disclosed is an apparatus and method which permits a manufacturer to precisely place a desired image on a screen to be used in a screen printing process. This result is accomplished by establishing a predetermined relationship between the screen frame and the image positive from which the image is to be formed on the screen. The method requires providing indicia of translational and rotational orientation on the image positive and aligning the image positive with respect to the screen frame by adjusting the position of the image positive in light of the location of separately-provided reference indicia located in a predetermined position with respect to the screen frame. Aligning the image positive indicia with the reference indicia is most easily accomplished by providing a microscope through which respective pairs of indicia may be observed simultaneously. The disclosed apparatus provides a means for readily performing the above steps.

3 Claims, 6 Drawing Figures

METHOD FOR IMAGE ALIGNMENT

BACKGROUND OF THE INVENTION

This invention relates to the art of screen printing. More particularly, it relates to a method and apparatus for forming an image in a predetermined orientation on a screen to be used for screen printing.

The act of screen printing has come into much greater importance in recent years as the reliance of industry upon mini-circuits became more and more prevalent.

The thick-film technique is one method employed in preparing such mini-circuits. In this method, a refractory substrate called a "chip" is printed with an appropriate paste in the desired pattern and thereafter fired at high temperatures to set the paste and bond it to the substrate. The pattern is formed on the chip by means of a screen printer. In one technique for forming the desired pattern on the screen itself, the entire screen is first coated with a photo-sensitive material. The screen is then covered with an image positive which serves to mask those areas of the screen which will correspond to areas on the chip where no paste is to be applied. The screen and image positive are then exposed to light which results in a reaction taking place only in the unmasked areas of the screen. Subsequently, the screen may then be rinsed or subjected to a reaction whereby only the desired areas of the screen have openings suitable for passing the paste through the screen whereas those areas which where masked by the image positive remain impermeable to such paste.

In the past, the image has been only roughly centered on the screen and the screen held in the screen printing machine by imprecise clamps or screws. Since screens must be periodically discarded and/or cleaned, it is necessary to have numerous screens with the same pattern if a continuous printing operation is desired. Under such circumstances, it has been necessary to adjust the screen printer each time the screen was charged so as to bring the screen image into correct lateral position relative to the substrate holder beneath. A substantial amount of operator time could be saved, and a reduction in the number of chips rejected for quality control reasons could be effected if the image on the screen could be so precisely located with respect to the substrate holder and screen frame that the operator may simply replace one screen for another and continue printing without making any adjustments to the screen printer.

SUMMARY OF THE INVENTION

It has now been discovered that the adjustment of image location can be greatly reduced or eliminated by the method and apparatus of the present invention. The proper use of this invention makes it possible to change or replace the screen insuring automatic alignment of the new and old images.

In accordance with the invention, the image positive is provided with indicia of translational and rotational orientation. The screen is affixed to a support frame and the support frame is then placed in a predetermined three-dimensional orientation. The image positive is placed on the screen, and the location of its indicia are then compared to reference indicia having predetermined positions with respect to the orientation of the frame. The image positive is then moved so as to align its indicia with the corresponding reference indicia, and once this result is accomplished, the image positive is then rendered immovable with respect to the frame. The desired image is then formed at the desired location on the screen by exposing the image positive to electromagnetic rays of sufficient frequency and intensity to form an image negative in a predetermined orientation on the screen.

DETAILED DESCRIPTION OF THE INVENTION

Figure 1:
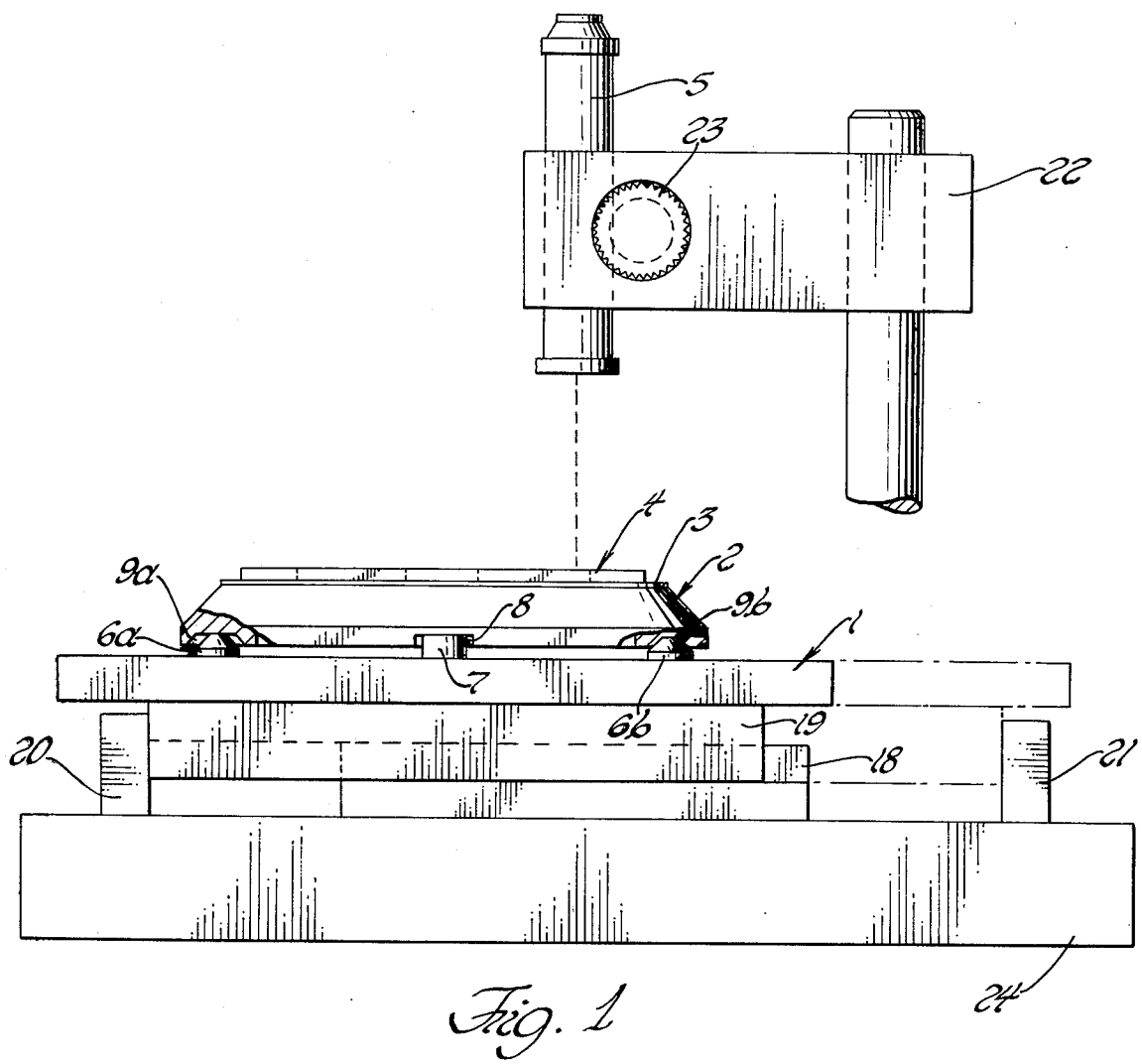
FIG. 1 is a front elevation view of the alignment apparatus of the present invention having an image-positive placed on the screen.

One apparatus embodying the present invention is illustrated in FIG. 1. The apparatus is composed of an adapter plate 1 fixed in a predetermined horizontal plane by any suitable means not shown; a screen support frame 2 having a photo-sensitized screen 3 rigidly adhered thereto in accordance with conventional procedures, means for providing contact between the frame and the adaptor plate so as to assure that the frame will be disposed in predetermined three-dimensional orientation with respect to the plate which means are composed in FIG. 1 of conical protrusions 6a and 6b on plate 1 adapted for contact with elongated conical depression 9a and conical depression 9b of the frame and cylindrical protrusion 7 of the plate adapted for contact with depression 8 of the frame. Once placed in position, the frame is maintained in the same orientation with respect to the plate by means of clamps or similar devices not shown. Image positive 4 is then placed on the screen and may be viewed through microscope 5 having reference indicia as shown in FIG. 3. The microscope is supported in a stationary position by support 22 and focus is locked by knob 23. The entire plate and frame assembly is adapted for linear movement by the provision of movable slide part 19 and permanent slide part 18 affixed to base 24. Movement of the slide is restricted at each end by blocks 20 and 21 respectively. In operation, the point fiducial mark is aligned with the cross hair when the frame rests against one block and the slope fiducial mark is aligned with the cross hair when the frame rests against the other block.

Figure 2:
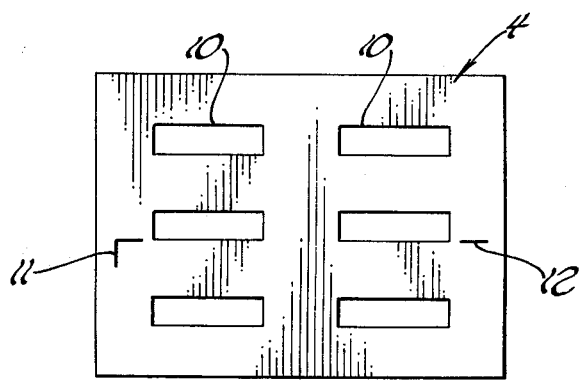
FIG. 2 is a plan view of the image-positive of FIG. 1.

FIG. 2 illustrates the image positive 4 of FIG. 1 having the desired image as represented by cutouts 10. The image positive has been provided with indicia of its translational and rotational orientation. The intersection of the two lines of fiducial mark 11 defines a point, whereas the horizontal line constituting fiducial mark 12 is a continuation of the horizontal line of fiducial mark 11 and thus defines a line passing through the point identified by fiducial mark 11. Thus, once it is known what horizontal plane the image-positive lies in, its translational and rotational position may be uniquely determined by reference to fiducial marks 11 and 12.

Figure 3A:
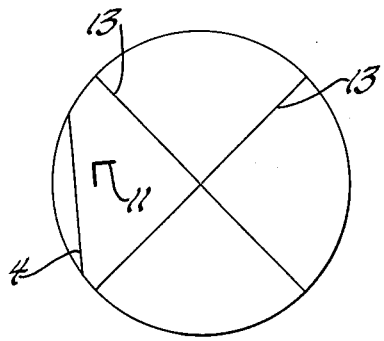
FIGS. 3a and 3b are plan views of the image-positive as seen through the microscope of FIG. 1 before and after alignment of the point fiducial mark.

FIG. 3a is a plan view of the image positive as seen through the microscope of FIG. 1 showing the image-positive fiducial mark 11 and cross-hair 13 prior to alignment. The reference fiducial mark represented by cross-hair 13 is built into the microscope.

Figure 3B:
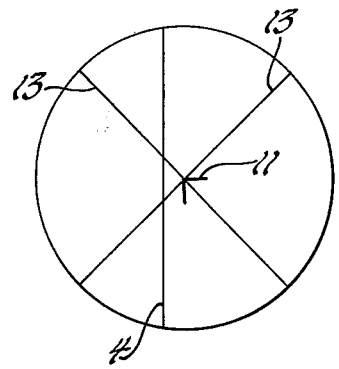

FIG. 3b depicts the view of the image positive after aligned. In operation, the adaptor plate, the screen support frame, and the screen are all in a predetermined fixed relationship to each other. Only the image positive remains unoriented. The operator may thus adjust the location of the image positive by any desired means until fiducial mark 11 coincides with reference fiducial mark 13. The frame is then slid to the opposite block and fiducial mark 12 aligned with reference fiducial mark 13. Once this has been accomplished, the image positive may be rendered immovable with respect to the frame by means of adhesive tape or any other suitable means. The frame may then be removed from the apparatus and subjected to suitable electromagnetic waves to form the image negative on the screen in the desired predetermined location.

Figure 4:
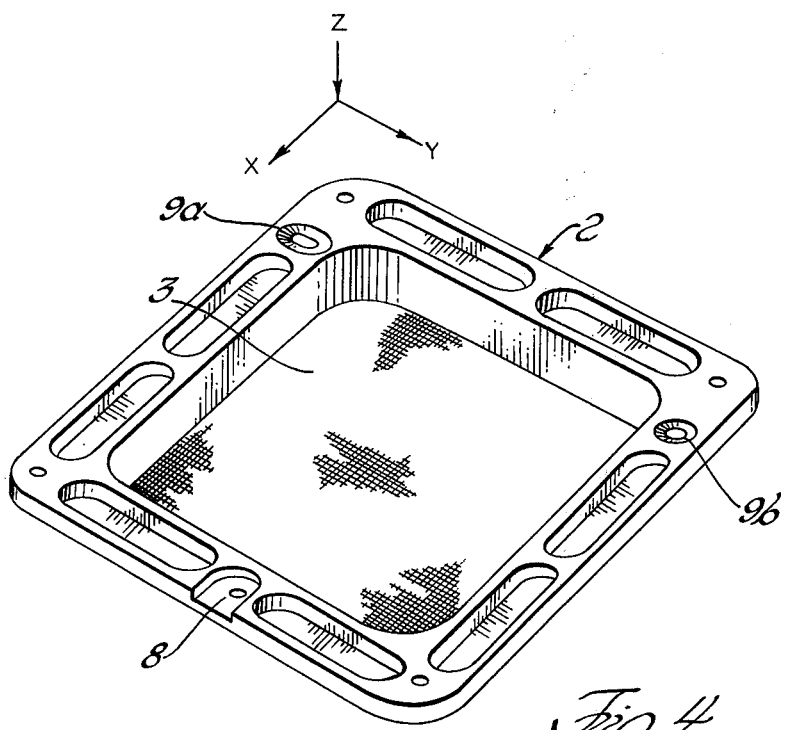
FIG. 4 is a perspective view of the frame of FIG. 1.
Figure 5:
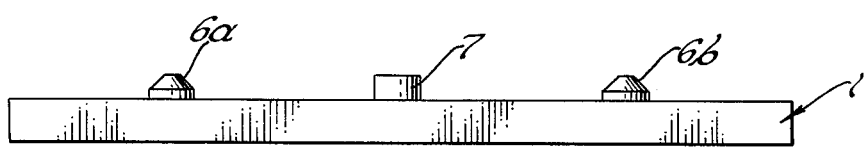
FIG. 5 is a front elevation view of the adaptor plate of FIG. 1.

It will be appreciated from the foregoing discussion that the use of fiducial marks 11, 12, and 13 as a means of determining the precise location of the image positive is dependent on the assumption that the image positive will always be in precisely the same horizontal plane. Should the image positive be disposed in a non-horizontal plane, or in a horizontal plane other than that presumed, the operator will have difficulty in aligning the fiducial marks or the resulting alignment will be inaccurate. FIGS. 4 and 5 illustrate one form of design for adaptor plate 1 and support frame 2 which will minimize the deviation of the plane of the screen from the horizontal. This design is particularly advantageous because great accuracy can be obtained without requiring unduly small tolerances in the machining of the parts. The preferred support frame is designed as shown in FIG. 4. The primary features of frame 2 are depressions 8, 9a and 9b. These depressions are adapted to cooperate with protrusions 6a, 6b and 7 of plate 1 as illustrated in FIG. 5. Protrusions 6a and 6b are in the form of truncated cones whereas protrusion 7 is cylindrical and flat-bottomed. The centers of the plate protrusions are spaced apart and oriented in a manner as identical as possible to the centers of the depressions 8, 9a and 9b of the frame. When the frame is placed on the plate, depression 9a receives protrusion 6a, depression 9b receives protrusion 6b, and depression 8 receives protrusion 7. The shape of depression 9b is that of a cone having a slope identical to that of protrusion 6b. The walls of depression 9a have a slope identical to that of protrusion 6a; however, depression 9a is not in the form of a simple cone, but is elongated. The contact between protrusion 6b and depression 9b coupled with the contact between protrusion 6a and depression 9a serves to uniquely define the translational and rotational orientation of the frame with respect to the plate. In other words, the frame is uniquely located in the X and Y directions. The contact between protrusion 7 and depression 8 serves to uniquely locate the frame in the Z direction with respect to the plate. The provision of an elongated depression 9a instead of a simple conical depression serves to greater improve the accuracy of the frame orientation in spite of slight deviations from the theoretical design distances. If depression 9a were a simple cone, then the distance between the centers of depressions 9a and 9b would have to be identical to the distance between the centers of protrusions 6a and 6b in order to prevent a skewing of the plane of the frame with respect to the plane of the plate. In the design shown, depression 9a is elongated along a line extending between the centers of depression 9a and 9b so as to permit an accurate orientation of the frame in spite of larger inaccuracies in machining.

The method of the invention thus involves the steps of providing a screen to be used in a screen printing operation with a photo-sensitive material and affixing it to a support frame in accordance with techniques well-known in the art. The frame is then placed in a predetermined three-dimensional orientation. The image-positive from which the image-negative will be formed on the screen is first provided with indicia sufficient to identify its translational and rotational orientation. The image-positive is then placed on the screen, and its location is adjusted by comparing the relationship between the image-positive indicia and reference indicia having a fixed position with respect to the orientation of the frame. Once the image positive has been adjusted so that the reference indicia coincide with the indicia on the image-positive, the image-positive is rendered immovable with respect to the frame by any suitable means, and the screen containing the affixed image-positive may thereafter be exposed to electromagnetic waves sufficient to form an image-negative on the screen in the predetermined orientation. The foregoing steps may be repeated as many times as desired using the same image-positive in order to form any number of screens, each of which has the image-negative located at precisely the same orientation with respect to the frame.

In the preferred method, the image-positive is provided with fiducial marks identifying a point and the slope of a line passing through that point on the image-positive and the orientation of the image-positive on the screen is then compared with the equivalent reference fiducial marks for alignment purposes. For simplicity, the reference indicia may be incorporated into a microscope so that the operator may observe and align both sets of indicia while observing the image-positive through the microscope.

The foregoing method results in an elimination of any adjustments on the part of the screen printing operator provided each frame he uses is affixed to the screen printing machine in precisely the same orientation. We have found that the means best suitable for this purpose is to provide an immobilized adaptor plate having protrusions identical to those of the adaptor plate of the alignment apparatus. Thus, the predictability of the orientation afforded by the plate and frame design of FIGS. 4 and 5 of the invention may also be utilized on the screen printing machine itself.

What is claimed is:

1. In a method for forming an image negative on a printing screen, the improvement which comprises locating said image on a photo-sensitized screen in a predetermined orientation by the steps of:

a. affixing said screen to a support frame;

b. providing indicia of translational and rotational orientation on an image positive by the application of fiducial marks identifying a point and the slope of a line passing through said point on said image positive;

c. placing said image positive on said screen;

d. providing reference indicia having predetermined positions with respect to the orientation of said frame, corresponding to the desired position of said image positive indicia;

e. aligning said image positive indicia with said reference indicia by placing said frame in a first predetermined three dimensional orientation and adjusting the location of said image positive so that the point fiducial mark coincides with the cross hair of an immovable microscope and then moving said frame to a second predetermined orientation in a direction parallel to the line defined by the desired orientation of said image positive fiducial marks and adjusting the location of said image positive so that said slope fiducial mark coincides with said cross hair and thereafter repeating the above alignments until each of said image positive fiducial marks is coincident with said cross hair, whereby said image positive is placed in a unique position with respect to said frame;

f. rendering said image positive immovable with respect to said frame; and g. thereafter subjecting said screen with image positive thereon to electromagnetic waves sufficient to form an image negative thereon in a predetermined orientation.

2. The method of claim 1 wherein said reference indicia are provided for viewing through a microscope and said aligning is accomplished by also observing said image positive indicia through said microscope and adjusting the corresponding pairs of indicia to coincide.

3. The method of claim 1 wherein said frame is placed in a predetermined three-dimensional orientation by providing an immovable plate with at least three first contact points and said frame with at least three second contact points and placing said frame in contact with said plate so as to bring respective pairs of said first and second points into contact with each other.

* * * * *